United States Patent [19]
Johansen

[11] Patent Number: 4,953,003
[45] Date of Patent: Aug. 28, 1990

[54] POWER SEMICONDUCTOR DEVICE

[75] Inventor: Jon-Willy Johansen, Kirchheim, Fed. Rep. of Germany

[73] Assignee: Siemens Aktiengesellschaft, Berlin and Munich, Fed. Rep. of Germany

[21] Appl. No.: 193,989

[22] Filed: May 13, 1988

[30] Foreign Application Priority Data

May 21, 1987 [DE] Fed. Rep. of Germany ....... 3717161

[51] Int. Cl.$^5$ ...................... H01L 23/54; H01L 23/48
[52] U.S. Cl. .......................................... 357/79; 357/71
[58] Field of Search ............................ 357/67, 79, 71

[56] References Cited

U.S. PATENT DOCUMENTS

| 3,885,243 | 5/1975 | Weisshaar et al. | 357/79 |
|---|---|---|---|
| 3,942,187 | 3/1976 | Gelsing et al. | 357/69 |
| 3,961,350 | 6/1976 | Tiefert | 357/15 |
| 4,035,831 | 7/1977 | Saeki | 357/79 |
| 4,300,149 | 11/1981 | Howard et al. | 357/675 |
| 4,305,087 | 12/1981 | Wislocky | 357/79 |
| 4,403,242 | 9/1983 | Tsuruoka | 357/71 |
| 4,408,216 | 10/1983 | Gould | 357/675 |
| 4,480,261 | 10/1984 | Hattori et al. | 357/71 |
| 4,505,029 | 3/1985 | Owyang et al. | 357/71 |
| 4,523,219 | 6/1985 | Heidegger et al. | 357/79 |
| 4,591,896 | 5/1986 | Kikuchi | 357/79 |
| 4,724,475 | 2/1988 | Matsuda | 357/79 |
| 4,885,630 | 12/1989 | Temple | 357/79 |

FOREIGN PATENT DOCUMENTS

| 804799 | 1/1969 | Canada. | |
|---|---|---|---|
| 1273073 | 7/1968 | Fed. Rep. of Germany. | |
| 2122487 | 11/1972 | Fed. Rep. of Germany. | |
| 2359787 | 6/1975 | Fed. Rep. of Germany. | |
| 2642721 | 4/1978 | Fed. Rep. of Germany. | |
| 3044514 | 9/1981 | Fed. Rep. of Germany. | |
| 46712 | 12/1967 | France | 357/79 |
| 59-92537 | 5/1984 | Japan | 357/67 |
| 46704 | 4/1967 | United Kingdom. | |

OTHER PUBLICATIONS

IBM Technical Disclosure Bulletin, vol. 29, No. 3, Aug. 1986, "Diffusion Barriers for CU".
Standard Search Report, File RS 78498 DE.

Primary Examiner—Andrew J. James
Assistant Examiner—Viet Q. Nguyen
Attorney, Agent, or Firm—Lawrence C. Edelman

[57] ABSTRACT

In a pressure-contacted power semiconductor device, a series of metallization layers provide a pressure-contacting electrode comprising a titanium layer upon a semiconductor body, and a copper layer over the titanium layer. To prevent oxidation of the surface of the copper layer at least one additional metallization layer is arranged over the copper layer.

17 Claims, 2 Drawing Sheets

POWER SEMICONDUCTOR DEVICE

BACKGROUND OF THE INVENTION

1. Field of the Invention

The invention relates to a power semiconductor device having a semiconductor body whose electrodes are provided with electrode connections. At least one of the electrodes is formed of several superposed metallization layers and is provided to make a pressure contact connection.

2. Description of the Prior Art

Such a power semiconductor device is described in, e.g. German Pat. Publication DE-OS No. 21 22 487. At least one of the electrodes shown therein consists of an aluminum layer which is in contact with the semiconductor body. The aluminum layer is provided with a silver layer upon its upper surface which, under pressure, presses against a contact electrode that acts as an electrode connection. The silver layer protects the aluminum layer against oxidation and provides a good contact to the contact electrode.

When such power semiconductor devices are provided with electrode connections making pressure contact, which may consist of, e.g., nickel-plated copper contact pieces, and are subjected to drastic load reversals, it frequently causes the device to fail. The chain of events is as follows: The nickel-plated copper contact piece becomes welded together, by its outer edge, with the electrode of the semiconductor body, which, after further changes in the load, leads to cracks in the silicon and thus to a loss of its ability to act as a barrier, and to the burning out of the components. The greater the temperature fluctuations and the contact pressure, the more frequent will be the occurrence of such a failure.

It is an object of the present invention to provide a power semiconductor device with an electrode for making pressure contact that will prevent a welding together of the electrode connection and electrode, and, in addition, provide good lateral conductivity.

SUMMARY OF THE INVENTION

In accordance with the principles of the invention, this object is achieved by making the first metallization layer a titanium layer and the second metallization layer superposed thereon, a copper layer. The copper layer has at least the same thickness as the titanium layer and is superposed on a surface of said titanium layer which is remote from the semiconductor body. A further metallization layer is arranged over the copper layer.

By using copper with a degree of hardness of 2.5 to 3 on the Mohs' hardness scale as the second metallization layer, a reduced creeping of material during the passage of current (electromigration) is achieved, as compared with an electrode made of aluminum. In addition, copper has approximately 1.6 times the conductivity of aluminum.

The titanium layer arranged between the semiconductor body and the copper layer serves as a diffusion barrier between the semiconductor body and the copper layer, and also as an adhesive base. Titanium also has the added advantage that it does not produce a doping effect in the semiconductor body.

In accordance with a further aspect of the invention, an aluminum layer is arranged between the surface of the semiconductor body and the titanium layer. This additional aluminum layer, preferably up to 0.1 microns thick, provides a good ohmic contact between the semiconductor body and the electrode. Thus, an undesirable Schottky contact is avoided. Alternatively, it is also possible to diffuse or alloy aluminum into the surface of the semiconductor body.

Although an IBM Technical Disclosure Bulletin Vol. 29, No. 3, Aug. 1986, Pgs. 1395 and 1396, mentions that copper can be used as a metallization layer for silicon bodies, it mentions only tantalum, titanium-nitride or silicon-nitride as a diffusion barrier. This publication does not contain any indication that a power semiconductor can be provided with such metallization layers in order to make a pressure contact or what the thickness of the copper layer ought to be.

Other features and advantages of the invention will be apparent from the description of the preferred embodiments, and from the claims.

For a fuller understanding of the present invention, reference should now be made to the following detailed description of the preferred embodiments of the invention and to the accompanying drawings.

DETAILED DESCRIPTION OF THE PREFERRED EMBODIMENTS

Figure 1:
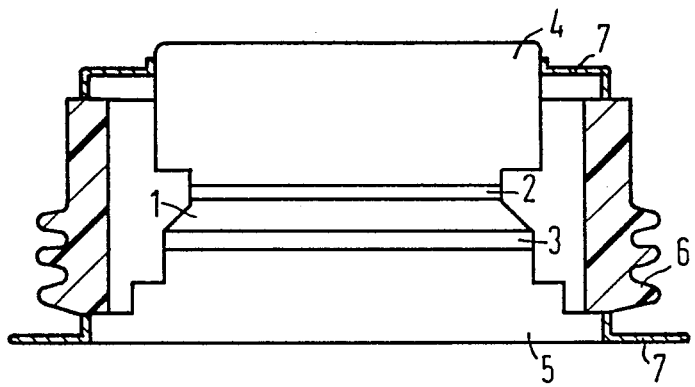
FIG. 1 illustrates a section-view through a prior art power semiconductor device having pressure contacts.

FIG. 1 shows, in cross-section, an encapsulated and pressure-contacted prior art power semiconductor device. The power semiconductor device has a semiconductor body 1, e.g., a semiconductor slice of silicon or gallium-arsenide. For making a pressure contact, semiconductor body 1 has electrodes 2 and 3 arranged on its main surfaces. Under pressure, contact electrodes 4 and 5 press against electrodes 2 and 3, respectively. Contact electrodes 4 and 5 constitute electrode connections for semiconductor body 1. Contact electrodes 4 and 5 and semiconductor body 1 lying between them with its electrodes 2 and 3 are, by means of a cylindrical insulating casing 6 having heat-dissipating flanges 7, joined together into a preferably gas-tight housing. The application of pressure needed to make contact between contact electrode 4 and electrode 2 or between contact electrode 5 and electrode 3, respectively, is achieved by, for example, screwing contact electrodes 4 and 5 into the housing, or by providing special cooling bodies that the entire power semiconductor device is clamped into, and through which pressure is exerted upon contact electrodes 4 and 5.

Figure 2:
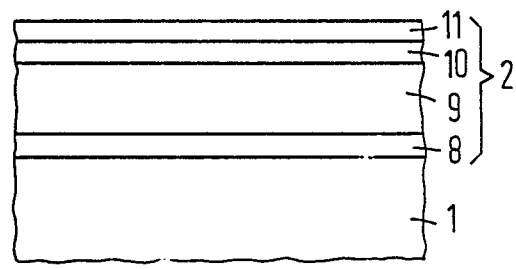
FIG. 2 illustrates a section-view of a portion of a power semiconductor device having an electrode constructed in accordance with the principles of the invention.

FIG. 2 shows a cutaway portion of a power semiconductor device that is provided with an electrode constructed in accordance with the principles of the invention. An electrode 2 is arranged at the point of semiconductor body 1 designed to make contact. This electrode 2 consists of the following metallization layers: A titanium layer 8 upon the area of the semiconductor body 1 designed to make contact, a copper layer 9 lying over titanium layer 8, a titanium layer 10 lying over copper layer 9, and a gold layer 11 lying over titanium layer 10.

In accordance with the invention, the thicknesses of these metallization layers should be kept within the following limits:

Titanium layer 8: 0.05 to 1 micron
Copper layer 9: 1 to 10 microns
Titanium layer 10: 0.05 to 1 micron
Gold layer 11: 0.1 to 0.5 microns It has proven advantageous that titanium layer 8 be 0.3 microns thick, copper layer be from 4 to 5 microns thick, titanium layer 10 be 0.5 microns thick and gold layer 11 be 0.1 microns thick.

The fact that copper layer 9 is from 1 to 200 times thicker, preferably from 10 to 20 times thicker than titanium layer 8, and thus thicker than the rest of metallization layers as well, results in good lateral conductivity for electrode 2.

Titanium layers 8 and 10 serve as diffusion barriers for copper against the material of the semiconductor body, e.g., silicon, or against the superposed gold layer 11. Furthermore, titanium layer 10 over copper layer 9 with gold layer 11 superposed on it, in turn, prevents the copper surface of copper layer 9 from oxidizing and thus contributing to a worsening of the contact. Titanium layer 8 presents the added advantage of serving as a good adhesive base for the overlying copper layer 9.

Metallization layers 8, 9, 10 and 11 are applied to the semiconductor body by, e.g., vapor deposition or sputtering. The titanium-silicon silicide formation is carried out at around 400° C. in forming or hydrogen gas.

Figure 3A:
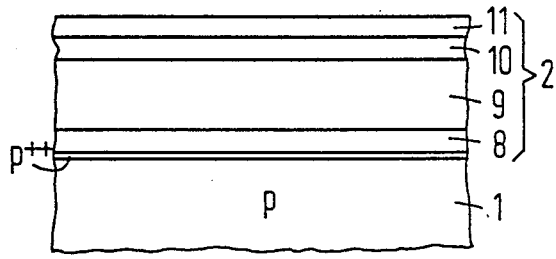
FIG. 3(a) illustrates a section-view of a portion of a power semiconductor device having aluminum diffusion and an electrode constructed in accordance with the principles of the invention.

FIG. 3(a) shows an electrode suitable for pressure contact, arranged upon an area of a power semiconductor body 1 designed for this purpose. In this example, this area of semiconductor body 1 is p-doped. In order to achieve an even stronger p-doping at the edge of this area, and thereby ensure good ohmic contact between semiconductor body 1 and electrode 2, aluminum is diffused or alloyed into the surface of this area of the semiconductor body 1. An even stronger p-doping at the edge of the area of the semiconductor body is achieved by means of this aluminum-doped zone of, e.g. 100 microns in thickness. An undesirable Schottky contact is thus avoided, and a good ohmic contact is formed between semiconductor body 1 and electrode. Metallization layers 8, 9, 10 and 11 correspond to those mentioned above with respect to FIG. 2.

Figure 3B:
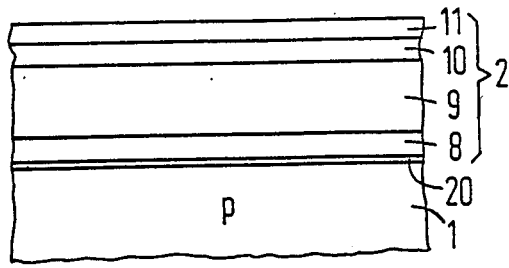
FIG. 3(b) illustrates a section-view of a portion of a pressure-contacted power semiconductor device in which an aluminum layer is arranged between the semiconductor body and the titanium layer.

FIG. 3(b) illustrates an alternative embodiment having an aluminum layer 20, preferably 0.1 microns thick, arranged between semiconductor body 1 and titanium layer 8. By means of additional aluminum layer 20, a good ohmic contact can also be achieved between semiconductor body 1 and electrode 2. The remaining portions of FIG. 3(b) are as already described above.

Figure 4:
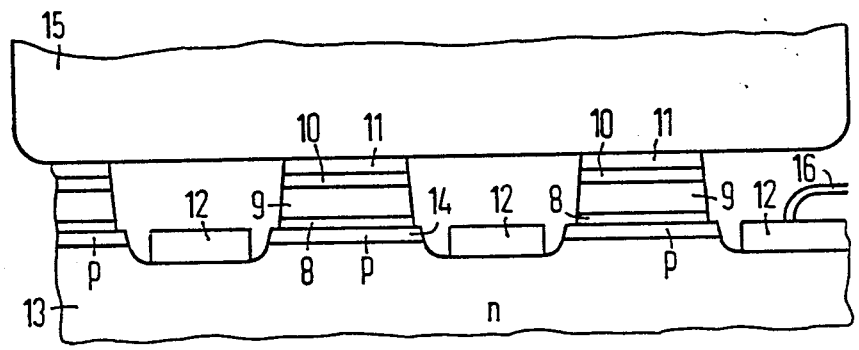
FIG. 4 illustrates a section-view of a cutaway portion of a thyristor having an electrode constructed in accordance with the principles of the invention.

FIG. 4 represents, for example, a cutaway portion of a thyristor. This thyristor is provided with at least one electrode for making pressure contact. In FIG. 4, a base region 13 is connected with 20 gate electrode 12. An emitter region 14 adjacent to base region 13 is connected with an electrode in accordance with the invention having metallization layers as mentioned in connection with FIGS. 2 and 3. As shown by the cross-section view of FIG. 4, emitter region 14 of semiconductor body 1 is distributed in island-fashion over the surface of semiconductor body 1. Emitter regions 14 lie at a higher level than the contacting surface of base regions 13. If gate electrode 12 for base region 13 is not thicker than the electrode formed by metallization layers 8, 9, 10 and 11, then the electrode of emitter region 14 can be pressure-contacted with a contact electrode. The contact electrode is designated 15 in FIG. 4 and lies under pressure upon the island-like emitter regions 14. Gate electrode 12 for base region 13 is coupled with a gate connection 16 by means of, e.g., soldering or bonding.

Figure 5:
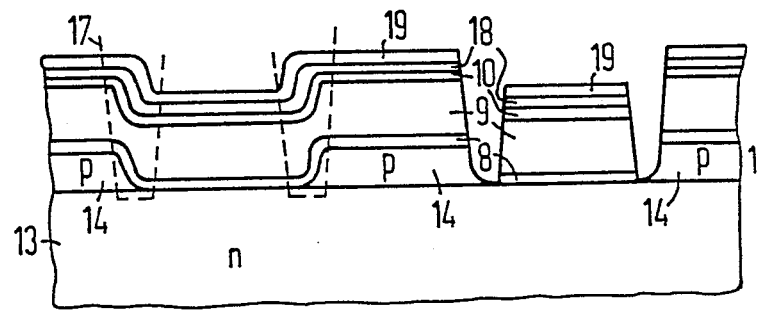
FIG. 5 illustrates a section-view of a portion of yet another thyristor having an electrode constructed in accordance with the principles of the invention.

FIG. 5 shows a further embodiment of the invention, with reference to a section-view portion of a thyristor. This portion of the thyristor corresponds to the section-view portion in FIG. 4. However, in contrast with FIG. 4, the electrode of base region 13 and the electrodes of emitter regions 14 consist of the same metallizing layers. This has the advantage that the same manufacturing process can be used for the manufacture of the electrodes for base region 13 and emitter regions 14. After the individual metallization layers have been applied to the entire semiconductor body 1, the metallization layers are again removed with an etching mask as indicated by broken lines 17, to avoid a short-circuit between the electrodes of the emitter regions 14 and base region 13.

The electrode shown in FIG. 5 differs from the electrodes in accordance with the invention mentioned above, in that a nickel layer 18 and another layer of gold 19 over that, are superposed on titanium layer 10. The thickness of nickel layer 18 in this arrangement is from 0.1 to 1 microns, and that of gold layer 19 from 0.1 to 0.5 microns. This electrode structure has the additional advantage that, aside from the properties in accordance with the invention, they are also quite bondable and solderable.

In contrast with the prior art electrode arrangements, an electrode structure in accordance with the principles of the invention is not as thick. During chemical etching, this results in less underetching. This also makes it possible to achieve a higher etching rate in plasma etching than has been possible with electrodes known up till now.

Thus, there has been shown and described novel apparatus for electrode connection to a semiconductor body which fulfills all the objects and advantages sought therefore. Many changes, modifications, variations and other uses and applications of the subject invention will, however, become apparent to those skilled in the art after considering this specification and the accompanying drawings which disclose preferred embodiments thereof. For example, the contact electrodes i.e., the counterparts, of the electrodes arranged on the semiconductor body, may consist of silver-plated or nickel-plated copper. Furthermore, silver-plated aluminum contact electrodes can be used as well or even nickel-plated or silver-plated molydenum contact electrodes. All such changes, modifications, variations and other uses and applications which do not depart from the spirit and scope of the invention are deemed to be covered by the invention which is limited only by the claims which follow.

What I claim is:

1. A power semiconductor device having a pressure contract structure and having a semiconductor body provided with electrodes, in which at least one of the electrodes is formed of several superposed metallization layers, wherein:
   a first one of said several metallization layers is superposed on said semiconductor body and is a first titanium layer;
   a second one of said several metallization layers is superposed on a side of said first titanium layer which is remote from said semiconductor body and is a copper layer, said copper layer having at least the same thickness as the thickness of said first titanium layer;
   a third one of said several metallization layers is superposed on said copper layer and is a second titanium layer; and
   a fourth one of said several metallization layers is arranged over said second titanium layer, said fourth layer being comprised of a conductive material.

2. A power semiconductor device in accordance with claim 1, where:
   said fourth one of said several metallization layers is a gold layer.

3. A power semiconductor device in accordance with claim 1, wherein:
   said fourth one of said several metallization layers is a nickel layer, and a gold layer is superposed over the nickel layer, said second titanium layer being arranged closest over said copper layer, said nickel layer being arranged over said second titanium layer and said gold layer being arranged over said nickel layer.

4. A power semiconductor device in accordance with claim 1, wherein:
   said copper layer is 10 to 20 times thicker than said first titanium layer.

5. A power semiconductor device in accordance with claim 2, wherein:
   said copper layer is 10 to 20 times thicker than said first titanium layer.

6. A power semiconductor device in accordance with claim 3, wherein:
   said copper layer is 10 to 20 times thicker than said first titanium layer.

7. A power semiconductor device in accordance with claim 1 wherein:
   an area of the semiconductor body in contact with said at least one of the electrodes is p-doped, and aluminum is diffused in or alloyed into this area between said first metallization layer and the semiconductor body to increase the concentration of doping material.

8. A power semiconductor device in accordance with claim 2, wherein:
   an area of the semiconductor body in contact with said at least one of the electrodes is p-doped, and aluminum is diffused in or alloyed into this area between said first metallization layer and the semiconductor body to increase the concentration of doping material.

9. A power semiconductor device in accordance with claim 3, wherein:
   an area of the semiconductor body in contact with said at least one of the electrodes is p-doped, and aluminum is diffused in or alloyed into this area between said first metallization layer and the semiconductor body to increase the concentration of doping material.

10. A power semiconductor device in accordance with claim 4, wherein:
    an area of the semiconductor body in contact with said at least one of the electrodes is p-doped, and aluminum is diffused in or alloyed into this area between said first metallization layer and the semiconductor body to increase the concentration of doping material.

11. A power semiconductor device in accordance with claim 5, wherein:
    an area of the semiconductor body in contact with said at least one of the electrodes is p-doped, and aluminum is diffused in or alloyed into this area between said first metallization layer and the semiconductor body to increase the concentration of doping material.

12. A power semiconductor device in accordance with claim 6, wherein:
    an area of the semiconductor body in contact with said at least one of the electrodes is p-doped, and aluminum is diffused in or alloyed into this area between said first metallization layer and the semiconductor body to increase the concentration of doping material.

13. A power semiconductor device in accordance with claim 1, further including:
    an aluminum layer arranged between a surface of the semiconductor body and said first titanium layer.

14. A power semiconductor device in accordance with claim 2, further including:
    an aluminum layer arranged between a surface of the semiconductor body and said first titanium layer.

15. A power semiconductor device in accordance with claim 3, further including:
    an aluminum layer arranged between a surface of the semiconductor body and said first titanium layer.

16. A power semiconductor device in accordance with claim 4, further including:
    an aluminum layer arranged between a surface of the semiconductor body and said first titanium layer.

17. A power semiconductor device in accordance with claim 7, further including:
    an aluminum layer arranged between a surface of the semiconductor body and said first titanium layer.

* * * * *